(12) United States Patent
Kim

(10) Patent No.: US 12,287,371 B2
(45) Date of Patent: Apr. 29, 2025

(54) CHARGING AND DISCHARGING JIG FOR MEASURING IMPEDANCE OF BATTERY CELL

(71) Applicant: LG ENERGY SOLUTION, LTD., Seoul (KR)

(72) Inventor: Ki Hyun Kim, Daejeon (KR)

(73) Assignee: LG ENERGY SOLUTION LTD., Seoul (KR)

( * ) Notice: Subject to any disclaimer, the term of this patent is extended or adjusted under 35 U.S.C. 154(b) by 133 days.

(21) Appl. No.: 18/026,552

(22) PCT Filed: Aug. 19, 2022

(86) PCT No.: PCT/KR2022/012415
§ 371 (c)(1),
(2) Date: Mar. 15, 2023

(87) PCT Pub. No.: WO2023/022563
PCT Pub. Date: Feb. 23, 2023

(65) Prior Publication Data
US 2024/0027527 A1    Jan. 25, 2024

(30) Foreign Application Priority Data
Aug. 20, 2021   (KR) .................. 10-2021-0110464

(51) Int. Cl.
*G01R 31/364*   (2019.01)
*G01R 31/36*    (2020.01)
(Continued)

(52) U.S. Cl.
CPC ....... *G01R 31/3644* (2013.01); *G01R 31/389* (2019.01); *H02J 7/0047* (2013.01); *H02J 7/0042* (2013.01)

(58) Field of Classification Search
None
See application file for complete search history.

(56) References Cited

U.S. PATENT DOCUMENTS

| 2005/0264296 | A1  | 12/2005 | Philbrook |
| 2018/0056809 | A1* | 3/2018  | Uchida .................. B60L 58/22 |
| 2020/0153030 | A1  | 5/2020  | Bae et al. |

FOREIGN PATENT DOCUMENTS

| CN | 212622977 U | 2/2021 |
| EP | 4227698 A1  | 8/2023 |

(Continued)

*Primary Examiner* — Jas A Sanghera
(74) *Attorney, Agent, or Firm* — Bryan Cave Leighton Paisner LLP

(57) ABSTRACT

A charging and discharging jig for measuring an impedance of a battery cell includes: a fixed block including a first charging/discharging bus bar on an upper surface of a first side of the fixed block; a movable block slidably coupled to the fixed block, the movable block including a second charging/discharging bus bar on an upper surface of a second side of the movable block opposite to the first side of the fixed block; a moving block slidably coupled to a bottom surface of the fixed block; and electric wires fixed to the first side of the fixed block and the second side of the movable block, the electric wires being configured to extend along the bottom surface of the fixed block and a bottom surface of the movable block.

15 Claims, 7 Drawing Sheets

(51) Int. Cl.
*G01R 31/389* (2019.01)
*H02J 7/00* (2006.01)

(56) References Cited

FOREIGN PATENT DOCUMENTS

| | | |
|---|---|---|
| JP | 06-134957 A | 5/1994 |
| JP | H07-198765 A | 8/1995 |
| JP | 2000-030763 A | 1/2000 |
| JP | 2006-322857 A | 11/2006 |
| JP | 2016-029994 A | 3/2016 |
| KR | 10-2008-0068305 A | 7/2008 |
| KR | 2008-0074240 A | 8/2008 |
| KR | 10-2011-0054676 A | 5/2011 |
| KR | 10-2012-0088120 A | 8/2012 |
| KR | 10-2014-0134518 A | 11/2014 |
| KR | 10-2017-0074550 A | 6/2017 |
| KR | 10-1969320 B1 | 4/2019 |
| KR | 10-2159041 B1 | 9/2020 |
| KR | 10-2021-0091935 A | 7/2021 |

\* cited by examiner

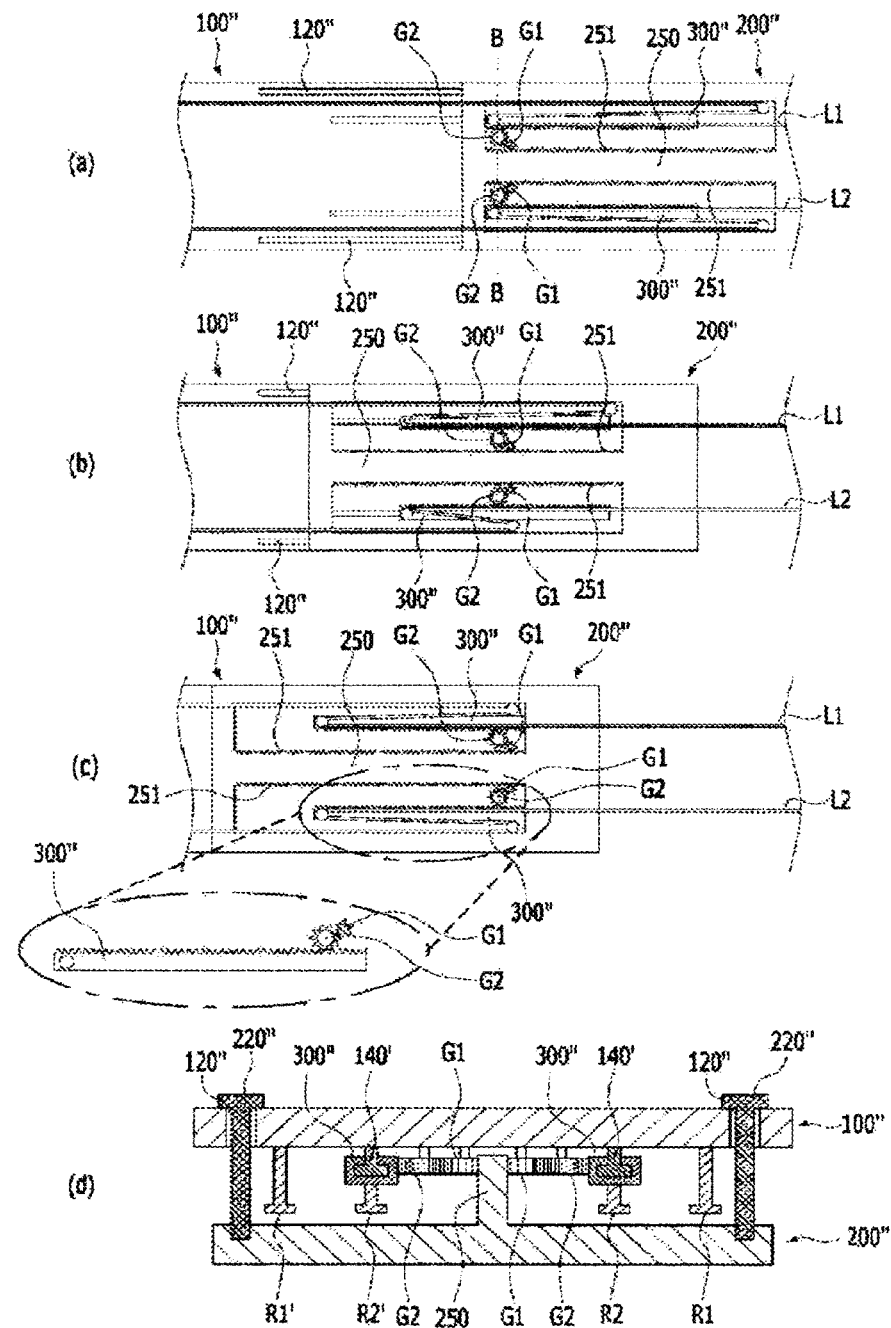
[FIG. 7]

CHARGING AND DISCHARGING JIG FOR MEASURING IMPEDANCE OF BATTERY CELL

CROSS-REFERENCE TO RELATED APPLICATION

This application is a National Phase entry pursuant to 35 U.S.C. 371 of International Application No. PCT/KR2022/012415 filed on Aug. 19, 2022, which claims priority to and the benefit of Korean Patent Application No. 10-2021-0110464, dated Aug. 20, 2021, and all contents published in the literature of the Korean patent application are incorporated as a part of the present specification.

TECHNICAL FIELD

The present disclosure relates to a charging and discharging jig for measuring an impedance of a battery cell.

More specifically, the present disclosure relates to a charging and discharging jig for measuring an impedance, which can consistently keep a length and tension of an electric wire for impedance measurement regardless of a variation in length of the charging and discharging jig.

BACKGROUND

Recently, secondary batteries capable of being charged and discharged have been widely used as energy sources for wireless mobile devices. In addition, secondary batteries are gaining attention as energy sources for electric vehicles and hybrid electric vehicles, being proposed as a measure to solve air pollution of conventional gasoline and diesel vehicles using fossil fuels. Therefore, types of applications using secondary batteries are diversifying due to the advantages of secondary batteries, and secondary batteries are expected to be applied in more fields and products in the future.

Secondary batteries may be classified into lithium ion batteries, lithium ion polymer batteries, and lithium polymer batteries according to an electrode and a composition of an electrolyte, and among these batteries, a use amount of the lithium ion polymer batteries, in which a probability of leakage of an electrolyte is low and which are easily manufactured, is increasing. Generally, according to a shape of a battery case, a secondary battery is classified as a cylindrical battery in which an electrode assembly is embedded in a cylindrical metal can, a square-type battery in which an electrode assembly is embedded in a square-type metal can, or a pouch-type battery in which an electrode assembly is embedded in a pouch-type case of an aluminum laminated sheet. The electrode assembly embedded in the battery case is formed as a structure of a positive electrode, a negative electrode, and a separator interposed between the positive electrode and the negative electrode and is a power generation element capable of being charged and discharged. The electrode assembly is classified as a jelly-roll type electrode assembly in which a separator is interposed between a positive electrode and a negative electrode, which are long sheets coated with an active material, and is wound, or a stack type electrode assembly in which a plurality of positive and negative electrodes, each having a predetermined size, are sequentially stacked with a separator interposed therebetween.

In order to inspect safety and performance of a secondary battery, various tests may be performed on the secondary battery. Among the various tests, a method of evaluating the safety and performance of a battery by measuring an impedance of a battery cell is considered reliable. In this way, the impedance of the battery cell is measured so that it is possible to estimate major factors such as lifetime, a capacity, and a state of charge.

A measured result of the impedance of the battery cell is varied according to a change in length of an electric wire or movement of the electric wire. In the case of a cylindrical battery with a short length and a large impedance value, an effect of an electric wire is relatively small, and in the case of a medium to large pouch-type battery with a long length and a small impedance value, a deviation of an impedance value measured according to the length or movement of the electric wire is large. The impedance of the battery cell can be measured by installing the battery cell in a charging and discharging jig which can be displaced in a length direction of the battery cell.

Specifically, the impedance is measured such that leads with different polarities of the battery cell are installed at charging/discharging bus bars installed on both sides of the charging and discharging jig, and electric wires are connected to the charging/discharging bus bars. In this case, the charging and discharging jig can be displaced in the length direction of the battery cell according to a type and a size of the battery to measure impedances for various battery cells. However, when the charging and discharging jig is displaced, the electric wire installed in the charging/discharging bus bar is also displaced, causing tension of the electric wire to vary. When the tension of the electric wire varies, the length of the electric wire located in an impedance measurement path also varies and the impedance cannot be accurately measured. That is, when the impedance is measured, since an external magnetic field varies according to the variation in length and tension of the electric wire, noise increases, and thus the impedance value varies whenever the measurement is performed, causing a problem in that the impedance cannot be measured with high accuracy. This problem is more severe in the case of a medium to large pouch-type battery having a long length and a small impedance value of a battery cell.

Therefore, there is a need to develop a device capable of measuring an impedance by maintaining a consistent length and tension of a battery cell regardless of displacement of the charging and discharging jig.

The background description provided herein is for the purpose of generally presenting context of the disclosure. Unless otherwise indicated herein, the materials described in this section are not prior art to the claims in this application and are not admitted to be prior art, or suggestions of the prior art, by inclusion in this section.

SUMMARY

An object of the present disclosure is to provide a charging and discharging jig for measuring an impedance, which can maintain a consistent length and tension of an electric wire for impedance measurement regardless of a variation in length of the charging and discharging jig.

In one embodiment of the present disclosure, a charging and discharging jig for measuring an impedance of a battery cell may be provided. the charging and discharging jig may include a fixed block including a first charging/discharging bus bar on an upper surface of a first side of the fixed block, a movable block slidably coupled to the fixed block, the movable blocking may include a second charging/discharging bus bar on an upper surface of a second side thereof opposite to the first side of the fixed block, a moving block slidably coupled to a bottom surface of the fixed block, and electric wires fixed to the first side of the fixed block and the second side of the movable block and the electric wires may be configured to extend along the bottom surface of the fixed block and a bottom surface of the movable block, wherein a first rod may protrude from a bottom side of the fixed block closer to the movable block than the moving block, and a first one of the electric wires extending from the first side of the fixed block forms first loop around the first rod, a second rod may protrude from the moving block, and the first one of the electric wires extending from the first loop may form a second loop around the second, and when the movable block slides with respect to the fixed block, the moving block may be interlocked with the movable block and may move in a same direction as the movable block so that a length of the first and a length of the second loop are adjusted to offset a variation in tension of the first one of the electric wires.

The charging and discharging jig may include an elastic member. A first end of the elastic member may be on the first side of the fixed block and a second end of the elastic member may be coupled to the moving block. The elastic member may apply a force to pull the moving block to the first side of the fixed block.

The charging and discharging jig may further comprise a first sensing line rod and second sensing line rod. The electric wires may include a signal line and a sensing line. The signal line and the sensing line may extend in parallel with each other along a bottom side of the fixed block and a bottom side of the movable block in the first direction, the first rod may be a first signal line rod and the first signal line rod and the first sensing line rod are on opposite side of the fixed block in a second direction, the moving block may be between the first signal line rod and the first sensing line rod, and the second rod may a second signal line rod and the second signal line rod and the second sensing line rod may be on opposite sides of the moving block in the second direction.

The movable block may be slidably coupled to an upper surface of the fixed block.

Guide slits may be formed on two sides of at least one of the fixed block and the movable block along the first direction, and sliding support members may be installed in the at least one of the fixed block and the movable block that does not include the guide slits.

Each of the sliding support member may include a body portion screwed to at least one of the fixed block or the movable block through at least one of the guide slits, and a head portion having a width that is greater than a width of the at least one of the guide slits.

A guide rail may be installed on a bottom surface of the fixed block, and the moving block may be slidably coupled to the guide rail.

Extension portions may be formed at an end portion of each of the first rod and the second rod.

An impedance measurement board may be coupled to a bottom portion of the first side of the fixed block, the electric wires fixed to the first side of the fixed block may be coupled to the impedance measurement board, and the electric wires fixed to the second side of the movable block may be coupled to the second charging/discharging bus bar.

An additional electric wire may be provided to connect the first charging/discharging bus bar to the impedance measurement board.

The movable block may be slidably coupled to the bottom surface of the fixed block, and the movable block may include a frame portion having a frame shape so that the moving block may be positioned inside the frame portion, and an inner surface of the frame portion of the movable block facing the moving block may be a stopper surface of the moving block.

The movable block may be slidably coupled to the bottom surface of the fixed block, and the movable block and the moving block may be coupled by a gear coupling.

The charging and discharging jig may include a first sensing line rod and a second sensing line rod. The electric wires may include a signal line and a sensing line which extend in parallel along the first side of the fixed block and the second side of the movable block in the first direction, the first rod may be a first signal line rod and the first signal line rod and the first sensing line rod may be on opposite sides of the fixed block in the second direction, the moving block may be configured as a moving block pair including a moving block for a signal line and a moving block for a sensing line, which are slidably coupled to the fixed block, respectively, at inner sides of a first signal line rod and a first sensing line rod, and the second rod may be a second signal line rod and the second signal line rod and the second sensing line may be on opposite sides of the fixed block in the second direction.

The movable block may include a frame portion having a frame shape, and a lengthwise shaft extending in a length direction of the movable block at an inner central portion of the frame portion and the lengthwise shaft may include first threads provided on both sides thereof, the moving block for a sensing line and the moving block for a signal line may be disposed between the lengthwise shaft and frame portions located on both sides of the movable block in the width direction, second threads may be on opposite surfaces of the moving block facing the lengthwise shaft, and the lengthwise shaft and the moving block may be coupled through gear trains installed between the moving block for a sensing line and the lengthwise shaft and between the moving block for a signal line and the lengthwise shaft.

The first gear train may include a first gear engaged with one of the first threads and a second gear engaged with one of the second threads, and the first gear and the second gear may be engaged at a gear ratio set such that a moving distance of moving block may be ½ of a moving distance of the movable block.

In accordance with a charging and discharging jig for measuring an impedance of a battery cell according to the present disclosure, even when a length of the charging and discharging jig varies, it is possible to measure an impedance of a battery cell with high accuracy by maintaining a consistent tension and length of an electric wire.

The effects of the present disclosure are not limited to the effects mentioned above and additional other effects not described above will be clearly understood from the description of the appended claims by those skilled in the art.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 7 is a schematic diagram illustrating a structure and an operating state of a charging and discharging jig for measuring an impedance of the battery cell according to still another embodiment of the present disclosure.

DETAILED DESCRIPTION

Figure 1:
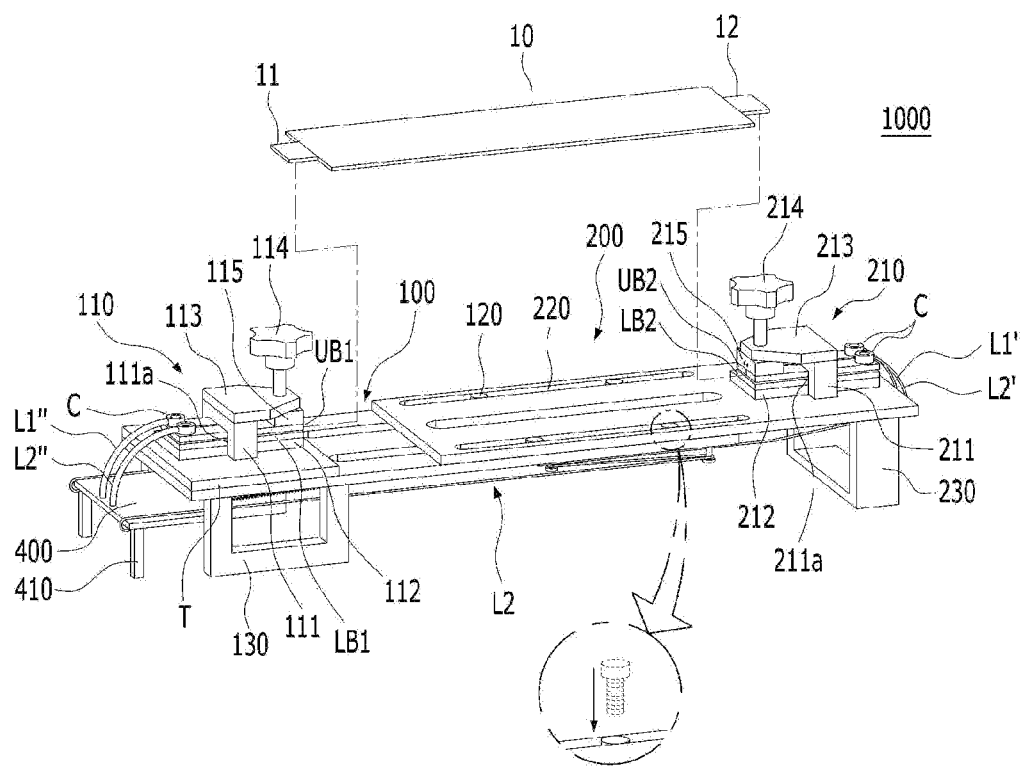
FIG. 1 is a perspective view illustrating a charging and discharging jig for measuring an impedance of a battery cell according to one embodiment of the present disclosure.

Hereinafter, the present disclosure will be described in detail. Before describing the present disclosure, terms or words used herein and the appended claims should not be construed to be limited to ordinary or dictionary meanings, but should be construed in accordance with meanings and concepts consistent with the technical spirit of the present disclosure according to the principle in that inventors can properly define concepts of terms in order to describe their disclosures with the best manner.

In the present application, the terms "comprising," "having," or the like are used to specify that a feature, a number, a step, an operation, a component, an element, or a combination thereof described herein exists, and do not preclude the presence or addition of one or more other features, numbers, steps, operations, components, elements, or combinations thereof. In addition, when a portion of a layer, a film, a region, a plate, or the like is referred to as being "on" another portion, this includes not only a case in which the portion is "directly on" the other portion but also a case in which another portion is present between the portion and the other portion. Conversely, when a portion of a layer, a film, a region, a plate, or the like is referred to as being "under" another portion, this includes not only a case in which the portion is "directly under" the other portion but also a case in which another portion is present between the portion and the other portion. In addition, in the present application, being disposed "on" may include the case of being disposed not only on an upper portion but also on a lower portion.

First Embodiment

Hereinafter, the present disclosure will be described in detail.

FIGS. 1 to 4 are a perspective view, a plan view, a side view, and a bottom view illustrating a charging and discharging jig for measuring an impedance of a battery cell according to one embodiment of the present disclosure.

A charging and discharging jig 1000 for measuring an impedance of a battery cell according to the present disclosure includes a fixed block 100 provided with first charging/discharging bus bars UB1 and LB1 on an upper surface of one side, a movable block 200 slidably coupled to the fixed block 100 and provided with second charging/discharging bus bars UB2 and LB2 on an upper surface of one side thereof opposite to one side of the fixed block 100, a moving block 300 slidably coupled to a bottom surface of the fixed block 100, and electric wires L1 and L2 fixed to the one side of the fixed block 100 and the other side of the movable block 200 and configured to extend along bottom surfaces of the fixed block 100 and the movable block 200. First rods R1 and R1' are installed to protrude from the bottom surface of the fixed block 100 closer to the movable block 200 than the moving block 300 so that electric wires L1 and L2 extending from the one side of the fixed block 100 forms first loop having a trajectory that turn on the first rods R1 and R1' and returns to the fixed block 100. Second rods R2 and R2' are installed to protrude from the moving block 300 so that the electric wires L1 and L2 extending from the first loop l1 forms second loop having a trajectory that turn on the second rods R2 and R2' goes to the movable block 200. When the movable block 200 slides with respect to the fixed block 100, the moving block 300 is moved in interlocking with the movable block 200 in the same direction so that lengths of the first and second loops l1 and l2 are adjusted to absorb variations in tension of the electric wires L1 and L2.

The charging and discharging jig 1000 for measuring an impedance of a battery cell according to the present disclosure is for measuring an impedance of a battery cell 10 during charging and discharging of the battery cell. Accordingly, the battery cell 10 is installed on an upper surface of the charging and discharging jig (see FIGS. 1 and 3).

In addition, in order to charge or discharge the battery cell 10, first and second charging/discharging bus bars UB1, LB1, UB2, and LB2, which are coupled to electrode leads 11 and 12 of the battery cell, are provided on both sides of the charging and discharging jig. The first charging/discharging bus bars UB1 and LB1 are installed on the upper surface of the one side of the fixed block 100, and the second charging/discharging bus bars UB2 and LB2 are installed on an upper surface of the other side of the movable block 200 opposite to the one side of the fixed block 100. In the present embodiment, in order to install the first and second charging/discharging bus bars UB1, LB1, UB2, and LB2, a first bus bar frame portion 110 and a second bus bar frame portion 210 are installed on upper surfaces of the one side of the fixed block 100 and the one side of the movable block 200, respectively. First and second bus bar frames 111 and 211 are provided on the first and second bus bar frame portions 110 and 210, respectively, and bus bar installation holes 111a and 211a into which the first and second charging/discharging bus bars UB1, LB1, UB2, and LB2 are inserted are formed in the first and second bus bar frames 111 and 211. The first and second charging/discharging bus bars UB1, LB1, UB2, and LB2 are inserted and positioned in the bus bar installation holes 111a and 211a. For coupling to the electrode leads 11 and 12 of the battery cell and connection to the electric wires L1 and L2, portions of the first and second charging/discharging bus bars UB1, LB1, UB2, and LB2 are installed to protrude from front ends and rear ends of the bus bar installation holes 111a and 211a.

The first and second charging/discharging bus bars UB1, LB1, UB2, and LB2 include upper bus bars UB1 and UB2 and lower bus bars LB1 and LB2. The electrode leads 11 and 12 protruding from both sides of the battery cell are inserted between the upper bus bars UB1 and UB2 and the lower bus bars LB1 and LB2, which protrude to front sides of the bus bar installation holes 111a and 211a of the first and second bus bar frames 111 and 121 so that charging or discharging is performed. Support frames 112 and 212 are formed in front lower portions of the bus bar installation holes 111a and 211a of the bus bar frames 111 and 121, and the lower bus bars LB1 and LB2 of the first and second charging/discharging bus bars are installed on the support frames 112 and 212. A member T installed below the support frame 112 at the first charging/discharging bus bars UB1 and LB1 is a reinforcing support for matching a height with the second charging/discharging bus bars UB2 and LB2. The upper bus bars UB1 and UB2 of the first and second charging/discharging bus bars are installed on the lower bus bars LB1 and LB2 with an interval from the lower bus bars LB1 and LB2. In order to install the upper bus bars UB1 and UB2, upper bus bar coupling frames 113 and 213 are formed to protrude from front upper portions of the bus bar installation holes 111a and 211a of the first and second bus bar frame portions 110 and 210. Upper bus bar adjustment knobs 114 and 214, each having a bolt-shaft structure, are installed in the upper bus bar coupling frames 113 and 213.

Meanwhile, insulators 115 and 215 are installed between the upper bus bar coupling frames 113 and 213 and the upper bus bars UB1 and UB2 of the first and second charging/discharging bus bars, and the insulators are coupled to upper portions of the upper bus bars UB1 and UB2. The upper bus bar adjustment knobs 114 and 214 are screw-coupled to the insulators 115 and 215 through the upper bus bar coupling frames 113 and 213. Accordingly, when the upper bus bar adjustment knobs 114 and 214 are rotated, the insulators 115 and 215 and the upper bus bars UB1 and UB2 are moved up or down. Thus, it is possible to easily insert and remove the electrode leads 11 and 12 of the battery cell between the upper bus bars UB1 and UB2 and the lower bus bars LB1 and LB2.

The structure for installing the first and second charging/discharging bus bars in the charging and discharging jig is merely one example, and thus the present disclosure is not limited to the above-described structure. A bus bar frame portion having a structure different from that of the above-described bus bar frame portion may be employed as long as it can insert the electrode leads 11 and 12 of the battery cell 10 between the upper bus bars UB1 and UB2 and the lower bus bars LB1 and LB2 of the first and second charging/discharging bus bars.

The charging and discharging jig 1000 for measuring an impedance according to the present disclosure includes the electric wires L1 and L2 for measuring an impedance. For impedance measurement, the electric wires L1 and L2 typically include a signal line L1 for applying an alternating-current (AC) signal and a sensing line L2 for sensing a response from a battery cell with respect to the applied signal. In addition, a power line (not shown) connected to a power source may be included as necessary. In order to simplify wiring, the power line may be twisted and coupled to the sensing line. In order to prevent noise from occurring in the AC signal, it is recommended to avoid coupling the power line to the signal line.

In order to avoid interference with the battery cell 10 installed in an upper portion of the charging and discharging jig, the electric wires L1 and L2 are installed to extend along the bottom surfaces of the fixed block 100 and the movable block 200. In addition, in order to prevent the lengths of the electric wires L1 and L2 from varying during a sliding movement of the movable block 200, which will be described below, the electric wires L1 and L2 are respectively fixed to one side of the fixed block 100 and the one side of the movable block 200. That is, the lengths of the electric wires L1 and L2 extending between one side of the fixed block 100 and the one side of the movable block 200 are kept constant.

Figure 4:
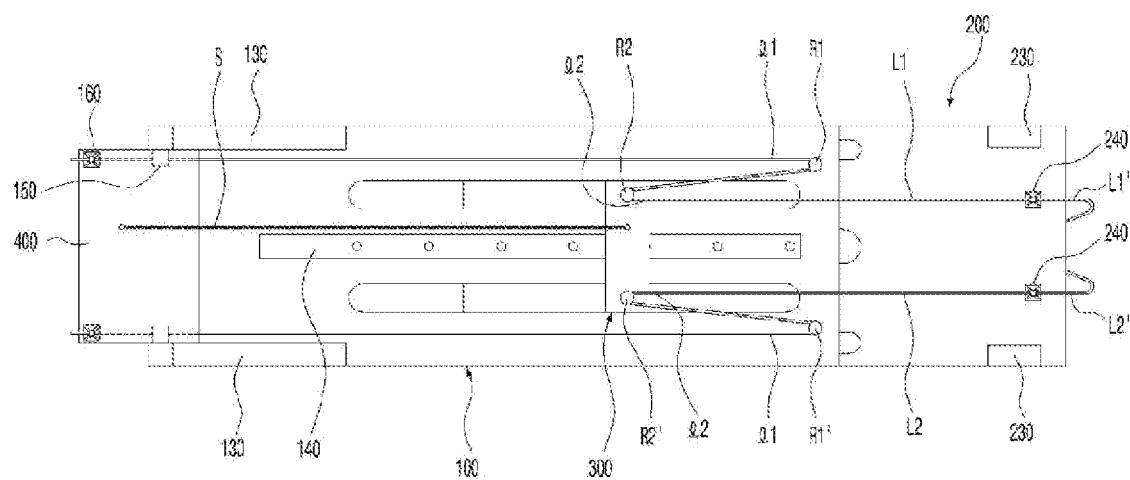
FIG. 4 is a bottom view illustrating the charging and discharging jig for measuring an impedance of a battery cell according to one embodiment of the present disclosure.

Referring to FIG. 4, predetermined fixing jigs 150 and 240 are installed to fix the electric wires L1 and L2 to one side of the fixed block 100 and the one side of the movable block 200.

The charging and discharging jig 1000 for measuring an impedance of a battery cell according to the present disclosure is provided with the first and second charging/discharging bus bars on both sides to which the electrode leads of the battery cell are coupled and is a charging and discharging jig capable of being displaced in the length direction of the battery cell. The displacement of the charging and discharging jig is achieved through sliding and a relative movement of the movable block 200 with respect to the fixed block 100.

Sliding coupling between the movable block 200 and the fixed block 100 may be achieved by coupling guide slits 220 and sliding support members 120. For example, the guide slits 220 may be formed on both sides of one of the fixed block 100 and the movable block 200 in the width direction, and the sliding support members 120 inserted into the guide slits may be installed in the other of the fixed block 100 and the movable block 200. The sliding support members 120 slide along the guide slits 220 so that the movable block 200 may slide to move along the fixed block 100. In this case, the guide slits 220 may be installed in either the fixed block 100 or the movable block 200. In the embodiment of FIGS. 1 to 4, the guide slits 220 are formed on both sides of the movable block 200 in the width direction, and the sliding support members 120 are formed on both sides of the fixed block 100 in the width direction. However, in embodiments of FIGS. 6 and 7 which will be described below, the guide slits 220 are formed in the fixed block 100, and the sliding support members 120 are formed in the movable block 200.

As shown in an enlarged view of a main part in FIG. 1, the sliding support member 120 may include a body portion inserted into the guide slit 220 and screw-coupled to the fixed block 100 (the embodiment of FIGS. 1 to 4) or screw-coupled to the movable block 200 (the embodiments of FIGS. 6 and 7), and a head portion having a width that is greater than that of the guide slit. Since the head portion has a width that is greater than that of the guide slit 220, it is possible to prevent the sliding support members 120 from being separated from the guide slit 220, and thus it is possible to prevent the movable block 200 from being separated from the fixed block 100. In addition, since the body portion of the sliding support member 120 is provided with a thread and is screw-coupled to the fixed block 100 or the movable block 200, the movable block 200 may be fixed to the fixed block 100 by adjusting a degree of a screw coupling. That is, as shown in the enlarged view of the main part in FIG. 1, after the movement of the movable block 200 is completed, when the sliding support member 120 is further rotated to move the head portion downward, the head portion presses both edges of the guide slit 220 so that the movable block 200 may be fixed to the fixed block 100.

The movable block 200 may be slidably coupled to an upper surface or a lower surface of the fixed block 100. In the embodiment of FIGS. 1 to 4, the movable block 200 is coupled to the upper surface of the fixed block 100, whereas in the embodiments of FIGS. 6 and 7, the movable block 200 is slidably coupled to the bottom surface of the fixed block 100. In the present specification, the movable block 200 is slidably coupled to the fixed block 100 due to the coupling between the guide slit 220 and the sliding support member 120, but the present disclosure is not limited thereto. For example, guide rails may be formed on both sides of one of the movable block 200 and the fixed block 100 in the width direction, and guide grooves coupled to the guide rail may be formed on both sides of the other of the movable block 200 and the fixed block 100 in the width direction. Alternatively, various types of sliding coupling structures applied in the field of mechanics may be employed between the movable block 200 and the fixed block 100.

The first and second charging/discharging bus bars are installed in the upper portion of one side of the fixed block 100 and the upper portion of the one side of the movable block 200 opposite to the one side of the fixed block 100, and support frames 130 and 230 are installed in a lower portion of one side of the fixed block 100 and a lower portion of the one side of the movable block 200 opposite to the one side of the fixed block 100. The support frames 130 and 230 are coupled to the fixed block 100 and the movable block 200, and the one side of the movable block 200 or the support frame 230 of the other side is moved to the fixed block 100 so that the charging and discharging jig may be displaced.

As described above, the electric wires L1 and L2 installed on the bottom surfaces of the fixed block 100 and the movable block 200 for impedance measurement are fixed to one side of the fixed block 100 and the one side of the movable block 200, respectively, so that the lengths of the electric wires L1 and L2 are kept constant. Here, the electric wires L1 and L2 may be fixedly installed on the bottom surface of one side of the fixed block 100 or the bottom surface of the one side of the movable block 200. However, the present disclosure is not limited thereto. For example, the electric wires L1 and L2 may be fixed to the support frame 130 connected to one side of the fixed block 100 and the support frame 230 connected to the one side of the movable block 200. That is, in the present disclosure, the fixing of the electric wires L1 and L2 to one side of the fixed block 100 and the one side of the movable block 200 includes a case of directly fixing them to the one side and the other side and a case of fixing them to other members coupled to the one side and the other side.

In addition to the lengths of the electric wires L1 and L2 being fixed, the present disclosure has a structure in which, when the electric wires L1 and L2 are moved due to the movement of the movable block 200, tension of the electric wires L1 and L2 is kept constant. To this end, the present disclosure is provided with the moving block 300 slidably coupled to a bottom surface of the fixed block 100. In addition, first rods R1 and R1' on which the electric wires L1 and L2 are caught and supported are provided on the bottom surface of the fixed block 100, and the moving block 300 is provided with second rods R2 and R2' on which the electric wires L1 and L2 are caught and supported. The sliding coupling of the moving block 300 may be coupling between a guide rail and a guide groove. For example, as shown well in FIGS. 3 and 4, a guide rail 140 may be installed on the bottom surface of the fixed block 100, and a guide groove of the moving block 300 may be coupled to the guide rail. Alternatively, a structure in which the guide groove is formed on the bottom surface of the fixed block 100 and the guide rail is installed in the moving block 300 is possible.

Figure 3:
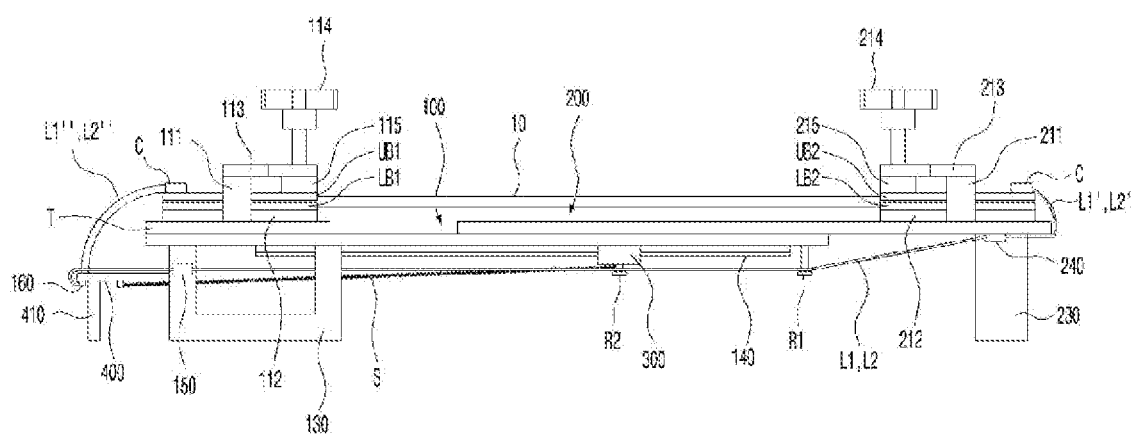
FIG. 3 is a side view illustrating the charging and discharging jig for measuring an impedance of a battery cell according to one embodiment of the present disclosure.

Referring to FIGS. 3 and 4, the first rods R1 and R1' are installed to protrude from the bottom surface of the fixed block 100 closer to the movable block 200 than the moving block 300. That is, the second rods R2 and R2' are installed to protrude from the moving block 300 at a side closer to the fixed block 100 than the first rods R1 and R1'.

Accordingly, as shown in FIG. 4, the electric wires L1 and L2 extending from one side of the fixed block 100 forms first loop having a trajectory that turns on the first rods R1 and R1' and returns to the fixed block 100, and the electric wires L1 and L2 extending from the first loop l1 forms second loop having a trajectory that turn on the second rods R2 and R2' and goes to the movable block 200. The present disclosure has a technical idea of varying the lengths of the first and second loops and absorbing variations in tension of the electric wires L1 and L2. That is, according to the present disclosure, when the movable block 200 slides to move with respect to the fixed block 100, the moving block 300 is moved in interlocking with the movable block 200 in the same direction so that lengths of the first and second loops are adjusted to absorb variations in tension of the electric wires.

For example, when the movable block 200 is moved toward the fixed block 100, the electric wires L1 and L2 fixed to the movable block 200 are moved together so that the tension of the electric wires L1 and L2 installed between the fixed block 100 and the movable block 200 may be loosened. In this case, when the moving block 300 is moved in the same direction of the movable block 200 in interlocking with the movement of the movable block 200, the electric wires L1 and L2 caught on the second rods R2 and R2' of the moving block 300 are moved together. Accordingly, the tension of the electric wires L1 and L2 is restored so that the electric wires L1 and L2 are kept tight again. Conversely, when the movable block 200 is moved away from the fixed block 100, excessive tension may be applied to the electric wires L1 and L2 fixed to the movable block 200. In this case, when the moving block 300 is moved in the same direction of the movable block 200 (that is, away from the fixed block 100) in interlocking with the movement of the movable block 200, the electric wires L1 and L2 caught on the second rods R2 and R2' of the moving block 300 are moved together. Accordingly, the tension applied to the electric wires L1 and L2 is released.

Referring to FIG. 4, the signal line L1 and the sensing line L2 extend in parallel along both sides of the fixed block 100 and the movable block 200 in the width direction. The signal line L1 and the sensing line L2 are fixed to one side of the fixed block 100 and the one side of the movable block 200, respectively, and extend along the bottom surfaces of the fixed block 100 and the movable block 200. According to the number of the electric wires L1 and L2, the first rods R1 and R1' are configured as a first rod pair including a first signal line rod R1 and a first sensing line rod R1' installed on both sides of the fixed block 100 in the width direction. The moving block 300 is installed between the first signal line rod R1 and the first sensing line rod R1', and the second rods R2 and R2' are also configured as a second rod pair including a second signal line rod R2 and a second sensing line rod R2' installed on both sides of the moving block 300 in the width direction according to the number of the electric wires L1 and L2. An extension portion is formed at each of ends of the first rod (pair) and the second rod (pair) to prevent the electric wires L1 and L2 from being separated from the rods (see FIG. 3).

There may be various mechanisms for interlocking the moving block 300 with the movable block 200 in the same direction. In the present embodiment, an elastic member S having one end installed on one side of the fixed block 100 and the other end coupled to the moving block 300 may be installed to achieve interlocking movement of the moving block 300 and the movable block 200. The elastic member S applies a force (an elastic force) to pull the moving block 300 to one side of the fixed block 100.

An interlocking movement process and a tension variation absorption process of the moving block 300 and the movable block 200 by the elastic member S will be described with reference to FIG. 5.

Figure 5:
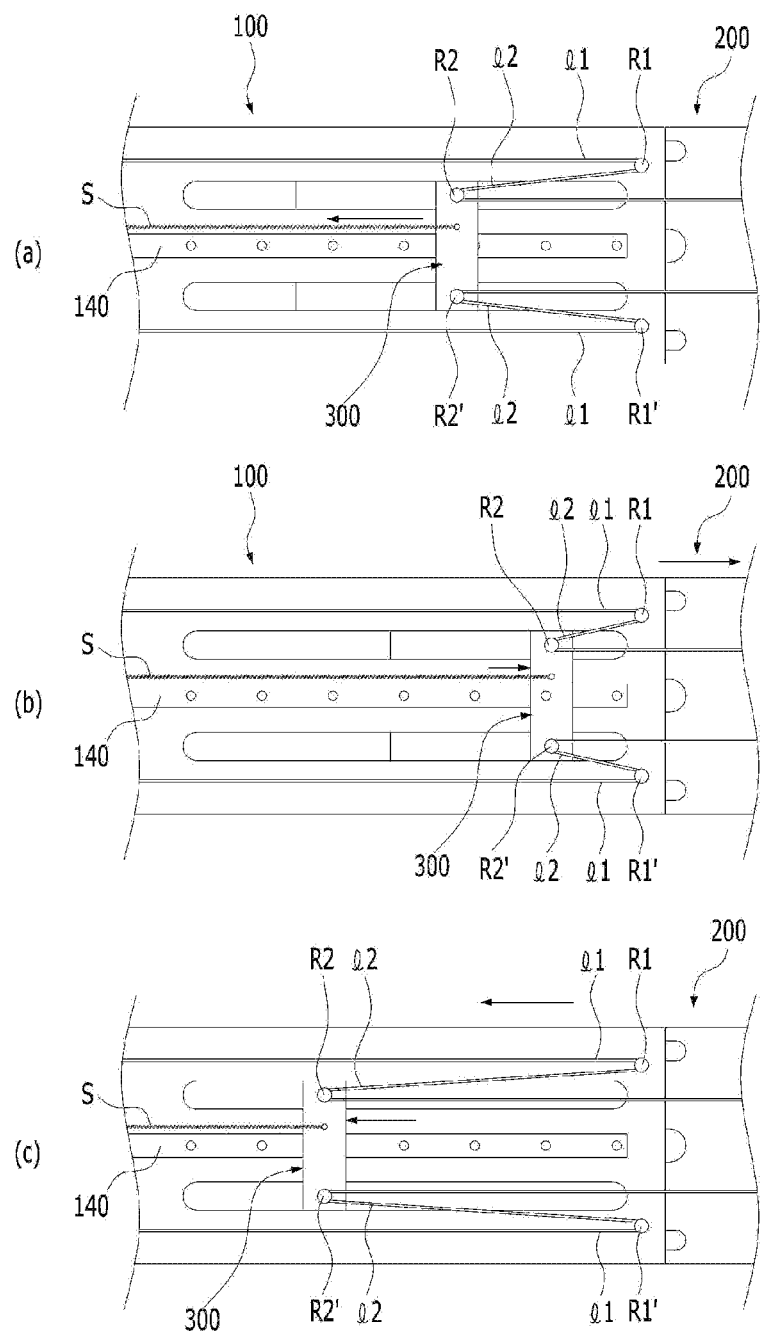
FIG. 5 is an operation state diagram illustrating the charging and discharging jig for measuring an impedance of a battery cell according to one embodiment of the present disclosure.

FIG. 5 is an operation state diagram illustrating the charging and discharging jig for measuring an impedance of a battery cell according to one embodiment of the present disclosure.

FIG. 5A is a diagram illustrating a state in which the elastic member S applies a force to the moving block 300 in a state in which the movable block 200 stops with respect to the fixed block 100. In this state, when the movable block 200 is pulled away from the fixed block 100 as shown in FIG. 5B, the electric wires L1 and L2 installed on the one side of the movable block 200 are pulled, and thus the electric wires L1 and L2 are wound and the second rods R2 and R2' forming the second loop l2 move in a moving direction of the movable block 200. That is, the moving block 300 having the second rod pair is moved in the same direction as the movable block 200. As the moving block 300 is moved, the tension applied to the electric wires L1 and L2 connected to the movable block 200 is released. In this case, the moving block 300 is moved toward the movable block 200 against the elastic force of the elastic member S. That is, an increase in tension of the electric wires L1 and L2 according to the movement of the movable block 200, and a decrease or absorption of the tension according to the interlocking movement of the moving block 300 are smoothly performed with assistance from the elastic force of the elastic member S.

Meanwhile, a case in which the movable block 200 is moved toward the fixed block 100 as shown in FIG. 5C from the state of FIG. 5A will be described. In this case, as the movable block 200 is moved toward the fixed block 100, the tension of the electric wires L1 and L2 fixed to the movable block 200 is lowered, whereas the elastic member S pulls the moving block 300 and the second rods R2 and R2' to move the moving block 300 toward the fixed block 100. Accordingly, the lowered tension is restored due to the movement of the moving block 300 and an action of the elastic force of the elastic member S.

According to the movements of the moving block 300 and the second rods R2 and R2', the length of the second loop l2 turning on the second rods R2 and R2' varies, and thus the length of the first loop l1 turning on the first rods R1 and R1' installed in the fixed block 100 also varies.

Accordingly, according to the present disclosure, the moving block 300 is moved in interlocking with the movable block 200 in the same direction so that the lengths of the first and second loops are adjusted and thus the variations in tension of the electric wires L1 and L2 are absorbed. Accordingly, the lengths of the electric wires L1 and L2 fixed to the fixed block 100 and the movable block 200 may be kept constant, and when the movable block 200 is moved, the tension may also be kept constant. When the lengths and tension of the signal line and the sensing line for impedance measurement are kept constant, the variations in length of the electric wires L1 and L2 or the variations in length thereof due to the variation in tension thereof are prevented. Accordingly, noise due to the variations in length of the electric wires L1 and L2 is prevented from being generated so that it is possible to more accurately measure the impedance of the battery cell.

Referring to FIGS. 1 to 4, an impedance measurement board 400 is coupled to a bottom portion of one side of the fixed block 100. As shown in the drawings, when the measurement board 400 for measuring an impedance is installed in the charging and discharging jig, there is no need to draw out the electric wires L1 and L2 long to the outside for impedance measurement. Accordingly, accuracy of impedance measurement may be further increased. In order to support the impedance measurement board 400, a measurement board support 410 is coupled to the impedance measurement board 400.

Figure 2:
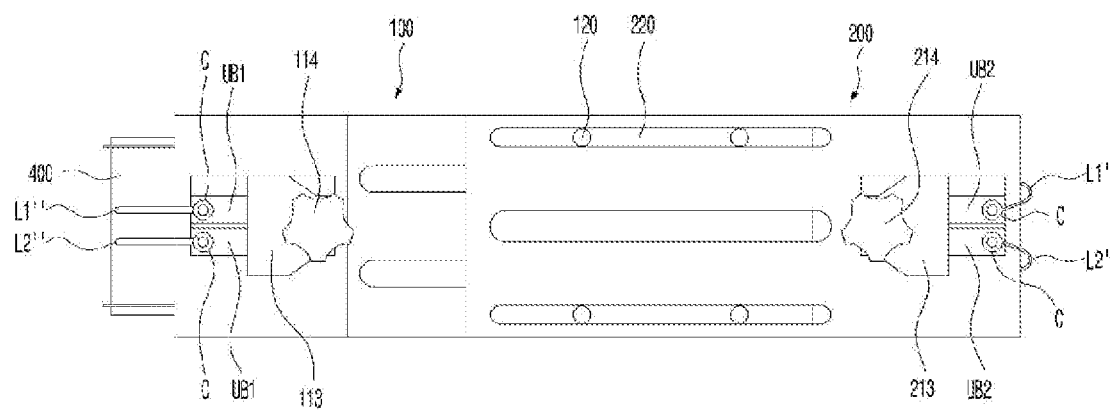
FIG. 2 is a plan view illustrating the charging and discharging jig for measuring an impedance of a battery cell according to one embodiment of the present disclosure.

In order to complete a circuit for measuring an impedance, the electric wires L1 and L2 fixed to a fixing jig 150 on one side of the fixed block 100 are extended and connected to the impedance measurement board 400. Reference numeral 160 denotes a coupling part (fixing jig) at which the extended electric wires are coupled to the impedance measurement board 400. The electric wires L1 and L2 fixed to the fixing jig 240 of the one side of the movable block 200 may be extended and coupled to the second charging/discharging bus bar. Electric wires L1' and L2' extending to the second charging/discharging bus bar are coupled to the second charging/discharging bus bar by a coupling member C (see FIG. 3). In addition, electric wires L1" and L2" connecting the first charging/discharging bus bar to the impedance measurement board 400 are additionally provided so that an impedance measurement circuit is completed by the impedance measurement board 400. The electric wires L1" and L2" are also coupled to the first charging/discharging bus bar through the coupling member C. For reference, in the present disclosure, in order to measure an impedance by a four-terminal method, the upper bus bars UB1 and UB2 are formed as two separate metal blocks as shown in FIG. 2, and the electric wires L1 and L2 of the signal line and the sensing line are connected to the metal blocks of the upper bus bars UB1 and UB2, respectively.

Second Embodiment

Figure 6:
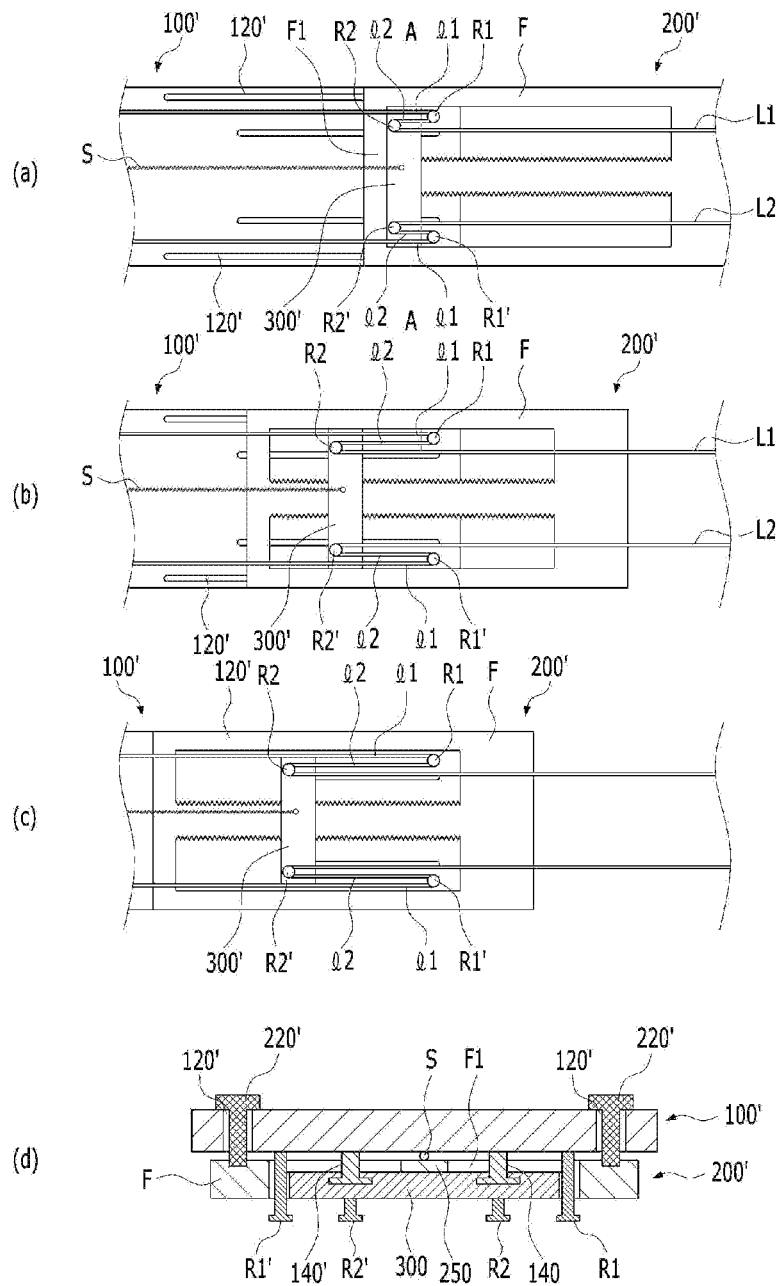
FIG. 6 is a schematic diagram illustrating a structure and an operating state of a charging and discharging jig for measuring an impedance of the battery cell according to another embodiment of the present disclosure.

FIG. 6 is a schematic diagram illustrating a structure and an operating state of a charging and discharging jig for measuring an impedance of the battery cell according to another embodiment of the present disclosure.

The present embodiment is the same as the first embodiment in that the elastic member S is installed to couple one side of a fixed block 100' to a moving block 300'. The second embodiment is different from the first embodiment in that a movable block 200' is slidably coupled to a bottom surface of the fixed block 100' instead of an upper surface thereof, and a pair of guide rails 120' for guiding the moving block 300' are formed on both sides of the fixed block 100' in a width direction.

In addition, the second embodiment is different from the first embodiment in that the movable block 200' is provided as a frame portion F having a frame shape, and the moving block 300' is positioned inside the frame portion F. When the moving block 300' is positioned inside the frame portion F, an inner surface F1 of a frame portion of the movable block 200' opposite to the moving block 300' may serve as a stopper surface of the moving block 300'.

Specifically, referring to FIG. 6A, the moving block 300' is slidably coupled to guide rails 120' of the fixed block 100' inside the frame portion F of the movable block 200'. In this state, the movable block 200' is disposed as far away from the fixed block 100' as possible so that the inner surface F1 of the frame portion of the movable block 200' is in contact with a front surface of the moving block 300'. That is, in this case, even when the elastic member S pulls the moving block 300', the moving block 300' is blocked by the inner surface F1 of the frame portion and cannot be moved toward the fixed block 100'. In this way, the inner surface F1 of the frame portion serves as a stopper surface of the moving block 300'.

When the movable block 200' is moved to the fixed block 100' in the state of FIG. 6A, the frame portion F of the movable block 200' is spaced apart from the moving block 300' so that the moving block 300' is interlocked and moved toward the fixed block 100' due to the elastic force of the elastic member S (see FIG. 6B). When the movable block 200' is further moved, the moving block 300' is also moved in interlocking with the movement of the movable block 200', and when the elastic force of the elastic member S is not applied, the moving block 300' is stopped (see FIG. 6C). Thus, even in the present embodiment, a decrease in tension of the electric wires L1 and L2 according to the movement of the movable block 200', and an increase or absorption of the tension according to the interlocking movement of the moving block 300' are smoothly performed with assistance from the elastic force of the elastic member S.

FIG. 6D is a side cross-sectional view along line A-A of FIG. 6A. As shown in the drawing, sliding support members 220' formed on both sides of the moving block 300' in the width direction are guided along the guide slits 120' formed on both sides of the fixed block 100' in the width direction. In addition, FIG. 6D shows well that the moving block 300' is provided with two guide grooves coupled to two guide rails 140 and 140' installed on a bottom surface of the fixed block 100' to be slidably coupled to the fixed block 100'. In addition, FIG. 6D shows that first rods R1 and R1' and second rods R2 and R2' are installed on both sides of the fixed block 100' in the width direction and both sides of the moving block 300' in the width direction.

Meanwhile, in addition to the frame portion F, the movable block 200' is provided with a lengthwise shaft 250 extending in a length direction of the movable block 200'. In the present embodiment, a thickness of the lengthwise shaft 250 is formed to be less than that of the frame portion so that the moving block 300 is supported on the lengthwise shaft 250 inside the frame portion F (see FIGS. 6A and 6D).

Third Embodiment

FIG. 7 is a schematic diagram illustrating a structure and an operating state of a charging and discharging jig for measuring an impedance of the battery cell according to still another embodiment of the present disclosure.

Unlike the first and second embodiments, the present embodiment employs a gear engagement structure as an interlocking moving structure between a moving block 300" and a movable block 200". That is, in the present embodiment, the movable block 200" is slidably coupled to a bottom surface of a fixed block 100", and the movable block 200" and the moving block 300" are coupled by gear coupling.

The present embodiment is different from the first embodiment in that the movable block 200" is slidably coupled to the bottom surface of the fixed block 100" instead of an upper surface thereof, and guide rails 120" for guiding the moving block 300" are formed on both sides of the fixed block 100" in a width direction.

Even in the present embodiment, electric wires L1 and L2 include a signal line and a sensing line extending in parallel along both sides of the fixed block 100" and the movable block 200" in the width direction. Thus, the first rods R1 and R1' are configured as a first rod pair including a first signal line rod R1 and a first sensing line rod R1' installed on both sides of the fixed block 100 in the width direction.

The present embodiment is different from the first and second embodiments in that two moving blocks 300" are provided. The moving blocks 300" are formed as a moving block pair including a moving block 300" for a signal line and a moving block 300" for a sensing line, which are slidably coupled to the fixed block 100, at inner sides from a first signal line rod and a first sensing line rod. Accordingly, second rods R2 and R2' are also formed as a second rod pair including a second signal line rod R2 and a second sensing line rod R2' which are installed on both sides of the moving block 300" in the width direction.

The gear engagement structure between the movable block 200" and the moving block 300" is as follows.

The movable block 200" includes a frame portion F having a frame shape, and a lengthwise shaft 250 extending in a length longitudinal direction of the movable block 200" in an inner central portion of the frame portion F and having first threads 251 formed on both side surfaces of the lengthwise shaft 250. In addition, the moving block 300" for the sensing line and the moving block 300" for the signal line are disposed between the lengthwise shaft 250 and frame portions F located on both sides of the movable block 200" in the width direction, and second threads are formed on side surfaces of the moving blocks 300" facing the lengthwise shaft 250.

The lengthwise shaft 250 and the moving blocks 300 are coupled through gear trains installed between the moving block 300" for the sensing line and the lengthwise shaft 250 and between the moving block 300" for the signal line and the lengthwise shaft 250.

In this case, the gear trains include first gears G1 engaged with the first threads 251, and second gears G2 engaged with the second threads, and the first gear G1 and the second gear G2 are engaged at a gear ratio set such that the moving block 300" for the sensing line and the moving block 300" for the signal line are moved by as much as a distance of ½ of a distance by which the movable block 200" is moved.

Specifically, referring to FIG. 7A, the moving block 300" for the sensing line and the moving block 300" for the signal line are gear-engaged with the lengthwise shaft 250 formed in the frame portion F of the movable block 200" with the first and second gears G1 and G2 therebetween. This state is a state in which the movable block 200" is placed as far away from the fixed block 100" as possible.

When the movable block 200" is moved to the fixed block 100" in the state of FIG. 7A, the lengthwise shaft 250 of the movable block 200" is moved to the fixed block 100", and the first gears G1 engaged with the first threads 251 of the lengthwise shaft are rotated. Accordingly, the second gears G2 engaged with the first gears G1 are also rotated, and the moving blocks 300" (the moving block for a sensing line and the moving block for a signal line) having the second threads engaged with the second gears G1 are interlocked and moved toward the fixed block 100" (see FIG. 7B). When the movable block 200" is further moved, the moving blocks 300" are also interlocked and moved due to the gear engagement, and at a point in time at which the movement of the movable block 200" is terminated, the rotation of the gears is stopped so that the moving blocks 300" are stopped (see FIG. 7C).

Even in the present embodiment, a decrease in tension of electric wires L1 and L2 according to the movement of the movable block 200", and an increase or absorption of the tension according to the interlocking movement of the moving blocks 300" are smoothly performed with assistance from the gear engagement. In this case, by adjusting the gear ratio between the first gear G1 and the second gear G2, the moving distances of the moving blocks 300″ with respect to the movement of the movable block 200″ may be adjusted. Thus, tension of the electric wires L1 and L2 supported by the second rods R2 and R2' of the moving blocks 300″ may be uniformly adjusted. For example, the gear ratio of the first gear and the second gear may be set such that the moving block 300″ for the sensing line and the moving block 300″ for the signal line are moved by as much as a distance of ½ of a distance by which the movable block 200″ is moved.

FIG. 7D is a side cross-sectional view along line B-B of FIG. 7A. As shown the drawing, sliding support members 220″ formed on both sides of the moving block 300″ in the width direction are guided along guide slits 120″ formed on both sides of the fixed block 100″ in the width direction. In addition, the moving block 300″ is formed as two moving blocks 300″ coupled to two guide rails 140 and 140' installed on a bottom surface of the fixed block 100″ and is provided with a second signal line rod R2 and a second sensing line rod R2' below the two guide rails 140 and 140'. In addition, FIG. 7D shows that first rods R1 and R1' are installed on both sides of the fixed block 100″ in the width direction.

In addition, FIG. 7D shows that the movable block 200″ is provided with the lengthwise shaft 250 extending in a length direction of the movable block in a central portion of the frame portion F, and the first and second gears G1 and G2 are gear-engaged between the lengthwise shaft 250 and the moving blocks 300. The first and second gears may be installed on the bottom surface of the fixed block 100″ to be stably supported.

Although the embodiments have been described with reference to a number of illustrative embodiments of the technical spirit of the present disclosure, it should be understood that numerous other modifications and embodiments can be devised by those skilled in the art that will fall within the spirit and scope of the principles of the present disclosure. The drawings disclosed herein, therefore, are not to be taken in a sense of limiting the technical concept of the present disclosure but for explanation thereof, and the range of the technical concept is not limited to these drawings. The scope of the present disclosure should be construed in accordance with the appended claims, along with the full range of equivalents to which such claims are entitled.

Meanwhile, although terms indicating upward, downward, left, right, front, and rear directions are used in the present specification, these terms are merely for convenience of description, and it is obvious that these terms may be varied according to a location of an object or an observer.

DESCRIPTION OF REFERENCE NUMERALS

- 10: battery cell
- 11 and 12: electrode leads
- 100, 100', and 100″: fixed blocks
- 110: first bus bar frame
- 120: guide slit
- 130: support frame
- 140: guide rail
- 150: electric wire fixing jig
- 160: electric wire fixing jig
- 200, 200', and 200″: movable blocks
- 210: second bus bar frame
- 220: sliding support member
- 230: support frame
- 240: electric wire fixing jig
- 300, 300', and 300″: moving blocks
- R1 and R1': first rods
- R2 and R2': second rods
- L1 and L2: electric wires
- l1 and l2: first loop and second loop
- S: elastic member
- F: frame portion
- F1: frame portion inner surface
- 250: lengthwise shaft
- 251: first thread
- G1: first gear
- G2: second gear
- 400: impedance measurement board
- 410: measurement board support

The invention claimed is:

1. A charging and discharging jig for measuring an impedance of a battery cell, the charging and discharging jig comprising:
    a fixed block including a first charging/discharging bus bar on an upper surface of a first side of the fixed block;
    a movable block slidably coupled to the fixed block, the movable block including a second charging/discharging bus bar on an upper surface of a second side of the movable block opposite to the first side of the fixed block;
    a moving block slidably coupled to a bottom surface of the fixed block; and
    electric wires fixed to the first side of the fixed block and the second side of the movable block, the electric wires being configured to extend along the bottom surface of the fixed block and a bottom surface of the movable block,
    wherein a first rod protrudes from a bottom side of the fixed block, at least a portion of the first rod being closer to the movable block than the moving block,
    wherein a first one of the electric wires extending from the first side of the fixed block forms a first loop around the first rod,
    wherein a second rod protrudes from the moving block, and the first one of the electric wires extending from the first loop forms a second loop around the second rod, and
    wherein, when the movable block slides with respect to the fixed block, the moving block is interlocked with the movable block and moves in a same direction as the movable block so that a length of the first loop and a length of the second loop are adjusted to offset a variation in tension of the first one of the electric wires.

2. The charging and discharging jig of claim 1, comprising an elastic member,
    wherein a first end of the elastic member is on the first side of the fixed block, and
    wherein a second end of the elastic member is coupled to the moving block, the elastic member applying a force to pull the moving block to the first side of the fixed block.

3. The charging and discharging jig of claim 2, further comprising a first sensing line rod, and a second sensing line rod,
    wherein the electric wires include a signal line and a sensing line, the signal line and the sensing line extending in parallel with each other along a bottom side of the fixed block and a bottom side of the movable block in a first direction,
    wherein the first rod is a first signal line rod, the first signal line rod and the first sensing line rod being on opposite sides of the fixed block in a second direction,
    wherein the moving block is between the first signal line rod and the first sensing line rod,
    wherein the second rod is a second signal line rod, and wherein the second signal line rod and the second sensing line rod are on opposite sides of the moving block in the second direction.

4. The charging and discharging jig of claim 3, wherein the movable block is slidably coupled to the upper surface of the fixed block.

5. The charging and discharging jig of claim 3, further comprising:
guide slits formed on two sides of at least one of the fixed block and the movable block along the first direction; and
sliding support members installed in the at least one of the fixed block and the movable block that does not include the guide slits.

6. The charging and discharging jig of claim 5, wherein each of the sliding support members includes:
a body portion screwed to at least one of the fixed block or the movable block through at least one of the guide slits; and
a head portion having a width greater than a width of the at least one of the guide slits.

7. The charging and discharging jig of claim 3, wherein the movable block is slidably coupled to the bottom surface of the fixed block,
wherein the movable block includes a frame portion having a frame shape so that the moving block is positioned inside the frame portion, and
wherein an inner surface of the frame portion of the movable block facing the moving block is a stopper surface of the moving block.

8. The charging and discharging jig of claim 1, wherein a guide rail is installed on the bottom surface of the fixed block, and
wherein the moving block is slidably coupled to the guide rail.

9. The charging and discharging jig of claim 1, wherein extension portions are formed at an end portion of each of the first rod and the second rod.

10. The charging and discharging jig of claim 1, wherein an impedance measurement board is coupled to a bottom portion of the first side of the fixed block,
wherein the electric wires fixed to the first side of the fixed block are coupled to the impedance measurement board, and
wherein the electric wires fixed to the second side of the movable block are coupled to the second charging/discharging bus bar.

11. The charging and discharging jig of claim 10, wherein an additional electric wire is provided to connect the first charging/discharging bus bar to the impedance measurement board.

12. The charging and discharging jig of claim 1, wherein the movable block is slidably coupled to the bottom surface of the fixed block, and
wherein the movable block and the moving block are coupled by a gear coupling.

13. The charging and discharging jig of claim 12, further includes a first sensing line rod and a second sensing line rod,
wherein the electric wires include a signal line and a sensing line which extend in parallel along the first side of the fixed block and the second side of the movable block in a first direction,
wherein the first rod is a first signal line rod, the first signal line rod and the first sensing line rod being on opposite sides of the fixed block in a second direction,
wherein the moving block is configured as a moving block pair including a moving block for a signal line and a moving block for a sensing line, which are slidably coupled to the fixed block, respectively, at inner sides of a first signal line rod and a first sensing line rod, and
wherein the second rod is a second signal line rod, the second signal line rod and the second sensing line rod being on opposite sides of the moving block in the second direction.

14. The charging and discharging jig of claim 13, wherein the movable block includes a frame portion having a frame shape, and a lengthwise shaft extending in a length direction of the movable block at an inner central portion of the frame portion, wherein the lengthwise shaft having first threads provided on both sides thereof,
wherein the moving block for a sensing line and the moving block for a signal line are disposed between the lengthwise shaft and frame portions located on both sides of the movable block in the width direction,
wherein second threads are on opposite side surfaces of the moving block facing the lengthwise shaft, and
wherein the lengthwise shaft and the moving block are coupled through gear trains installed between the moving block for a sensing line and the lengthwise shaft and between the moving block for a signal line and the lengthwise shaft.

15. The charging and discharging jig of claim 14, wherein the gear trains include a first gear engaged with one of the first threads and a second gear engaged with one of the second threads, and
wherein the first gear and the second gear are engaged at a gear ratio set such that a moving distance of the moving block is ½ of a moving distance of the movable block.

* * * * *